(12) United States Patent
Young et al.

(10) Patent No.: US 11,043,437 B2
(45) Date of Patent: Jun. 22, 2021

(54) TRANSPARENT SUBSTRATE WITH LIGHT BLOCKING EDGE EXCLUSION ZONE

(71) Applicant: Applied Materials, Inc., Santa Clara, CA (US)

(72) Inventors: Michael Yu-tak Young, Cupertino, CA (US); Ludovic Godet, Sunnyvale, CA (US); Robert Jan Visser, Menlo Park, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/241,427

(22) Filed: Jan. 7, 2019

(65) Prior Publication Data
US 2020/0219819 A1 Jul. 9, 2020

(51) Int. Cl.
| | |
|---|---|
| *H01L 23/544* | (2006.01) |
| *H01L 23/15* | (2006.01) |
| *G03F 9/00* | (2006.01) |
| *H01L 21/67* | (2006.01) |
| *H01L 27/12* | (2006.01) |
| *H01L 21/68* | (2006.01) |

(52) U.S. Cl.
CPC ............ *H01L 23/15* (2013.01); *G03F 9/7084* (2013.01); *H01L 21/67282* (2013.01); *H01L 23/544* (2013.01); *H01L 27/1262* (2013.01); *H01L 21/681* (2013.01); *H01L 2223/54493* (2013.01)

(58) Field of Classification Search
CPC .............. H01L 23/54; H01L 21/67282; H01L 2223/54493; H01L 21/681; H01L 27/1262; H01L 23/15; G03F 9/7084
See application file for complete search history.

(56) References Cited

U.S. PATENT DOCUMENTS

| | | | |
|---|---|---|---|
| 5,887,064 | A | 3/1999 | Seysen |
| 6,596,965 | B2 | 7/2003 | Jeong et al. |
| 6,710,364 | B2 | 3/2004 | Guldi et al. |
| 7,315,421 | B2 | 1/2008 | Fujihara et al. |
| 7,611,960 | B2 | 11/2009 | Liu et al. |
| 7,727,785 | B2 | 6/2010 | Connell et al. |
| 8,557,715 | B2 | 10/2013 | Chung et al. |
| 8,871,605 | B2 | 10/2014 | Lin et al. |
| 9,352,466 | B2 | 5/2016 | Liao et al. |
| 9,449,864 | B2 | 9/2016 | Lin et al. |
| 9,589,901 | B2 | 3/2017 | Koo et al. |
| 9,601,436 | B2 | 3/2017 | Lai et al. |

(Continued)

FOREIGN PATENT DOCUMENTS

| | | |
|---|---|---|
| JP | 2001167993 A | 6/2001 |
| JP | 2005223304 A | 8/2005 |

(Continued)

OTHER PUBLICATIONS

Office Action in related Application TW 108148292 dated Feb. 18, 2021.

*Primary Examiner* — Shouxiang Hu
(74) *Attorney, Agent, or Firm* — Patterson + Sheridan LLP

(57) ABSTRACT

Embodiments of the present disclosure generally relate to an optically transparent substrate, comprising a major surface having a peripheral edge region with an orientation feature formed therein, and a texture formed on the peripheral edge region, the texture having an opacity that is greater than an opacity of the major surface.

18 Claims, 2 Drawing Sheets

(56) References Cited

U.S. PATENT DOCUMENTS

| | | |
|---|---|---|
| 2005/0233550 A1 | 10/2005 | Fujihara et al. |
| 2007/0031933 A1 | 2/2007 | Otte et al. |
| 2007/0159631 A1* | 7/2007 | Huang ............... G03F 9/7011 356/400 |
| 2007/0190756 A1 | 8/2007 | Uchida |
| 2010/0308441 A1 | 12/2010 | Chung et al. |
| 2012/0276689 A1* | 11/2012 | Canale ................... C03C 17/00 438/106 |
| 2014/0017463 A1 | 1/2014 | Chung et al. |
| 2016/0070161 A1* | 3/2016 | Fetterman .......... B29C 33/3892 353/28 |

FOREIGN PATENT DOCUMENTS

| | | |
|---|---|---|
| JP | 2006080339 A | 3/2006 |
| JP | 2010103258 A | 5/2010 |
| KP | 1020090110086 A | 10/2009 |

* cited by examiner

TRANSPARENT SUBSTRATE WITH LIGHT BLOCKING EDGE EXCLUSION ZONE

BACKGROUND

Field

Embodiments of the present disclosure generally relate to methods and apparatus for detecting a notch or flat of an optically transparent substrate utilized in electronic device fabrication processes.

Description of the Related Art

In the manufacture of electronic devices on a substrate, substrates, such as a semiconductor substrate, are aligned in a chamber by finding an indicator, such as a notch or a flat on an edge of the substrate. These semiconductor substrates are typically made of silicon, germanium, or some combination thereof, and are generally opaque or reflective which makes flat or notch detection relatively simple using light. For example, light is absorbed or reflected at any point on the substrate except in the area where the notch or flat is positioned.

However, when an optically transparent substrate is used, light passes through the material in basically the same manner as the notch or the flat. This transparent property makes flat or notch detection virtually impossible using conventional detection hardware.

Thus, there is a need for a method and apparatus that enables detection of notches or flats on optically transparent substrates.

SUMMARY

Embodiments of the present disclosure generally relate to an optically transparent substrate utilizable in electronic device manufacturing as well as a method of detecting a notch or flat of the optically transparent substrate. The detection method enables precise positioning of the substrate as well as mapping and/or positioning of the substrate.

In one embodiment, an optically transparent substrate is disclosed that includes a major surface having a peripheral edge region with an orientation feature formed therein, and a texture formed on the peripheral edge region, the texture having an opacity that is greater than an opacity of the major surface.

In another embodiment, a substrate for electronic device formation is disclosed. The substrate includes a major surface having a peripheral edge region with an orientation feature formed therein and having a first average surface roughness (Ra), and a texture formed on the peripheral edge region, the texture having a second Ra that is greater than the first Ra, wherein the peripheral edge region has an opacity that is greater than an opacity of the major surface.

In another embodiment, a method is disclosed that includes providing an optically transparent substrate having an indexing feature, and forming a texture onto a peripheral edge region of the substrate, the texture having an Ra that is greater than an Ra of a major surface of the substrate, wherein the peripheral edge region has an opacity that is greater than an opacity of the major surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to an optically transparent substrate utilizable in electronic device manufacturing as well as a method of detecting a notch or flat of the optically transparent substrate. The detection method enables precise positioning of the substrate as well as mapping and/or positioning of the substrate. Unless otherwise noted, the term "substrate" or "substrates" as used herein consists of a substrate that is round or rectangular in plan view, and is made of an optically transparent material, such as a glass material or a quartz material.

Figure 1:
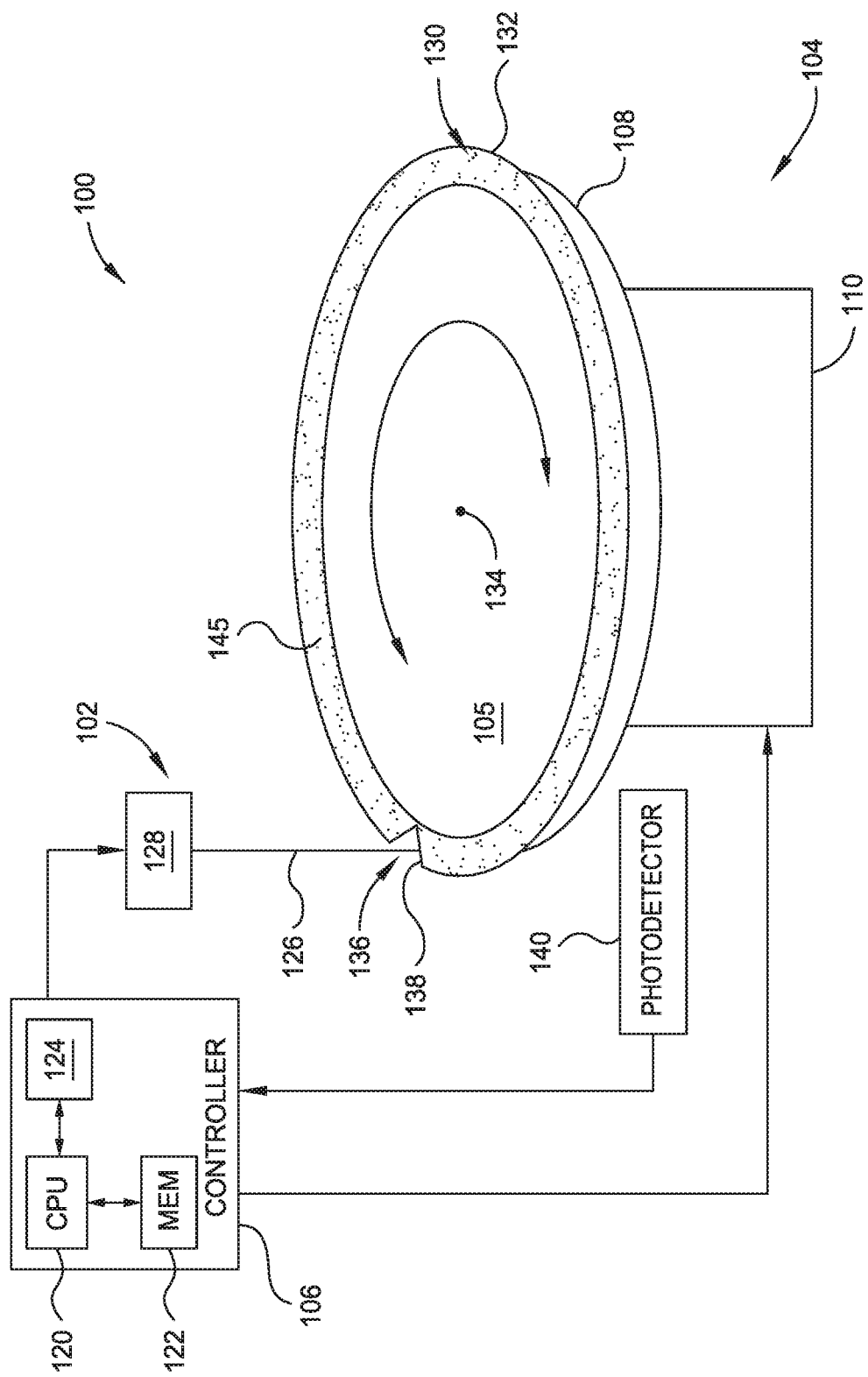
FIG. 1 depicts a simplified, schematic diagram of a substrate processing system.

FIG. 1 depicts a simplified, schematic diagram of a substrate processing system 100. The substrate processing system 100 contains a substrate orientation detector 102 and a substrate platen assembly 104 that supports an optically transparent substrate 105. The substrate processing system 100 also includes a controller 106. The substrate platen assembly 104 retains the substrate 105 and, in response to signals from the controller 106, rotates and translates the substrate 105 relative to the substrate orientation detector 102.

The platen assembly 104 contains a substrate support 108 and a platen drive 110. The substrate support 108 is a generally circular plate that holds the substrate 105 in a substantially horizontal orientation using a vacuum chucking device or an electrostatic chucking device. The platen drive 110 is coupled to the substrate support 108 by a shaft (not shown). The drive 110 rotates the shaft to rotate the substrate support 108 up to 360 degrees along the direction indicated by the circular arrow in FIG. 1.

The controller is a general purpose computer (e.g., comprising a central processing unit (CPU) 120, memory 122 and various support circuits 124 such as power supplies, cache, input/output (I/O) circuits and the like) that is programmed to cause the system 100 to perform routines and methods for identifying a notch or a flat on the optically transparent substrate 105. Alternatively, the controller can be a dedicated microprocessor or application specific integrated circuit (ASIC) that is specially designed or programmed to control the system 100.

To perform substrate orientation, the substrate 105 is rotated and the substrate orientation detector 105 directs a beam of light 126 from a light source 128 toward a peripheral edge region 130 of the optically transparent substrate 105. The peripheral edge region 130 is typically an area of the optically transparent substrate 105 that is not utilized for device fabrication and is known in the art as the edge exclusion zone. For example, the peripheral edge region 130 is generally about 3 millimeters (mm) measured in a radial direction from an edge 132 to a center 134 of the optically transparent substrate 105. In this peripheral edge region 130, an orientation feature 136 is provided. The orientation feature 136 may be a flat formed on or in the peripheral edge 130, or a notch 138 as shown in FIG. 1. When the orientation feature 136 is positioned relative to the beam of light 126 as shown in FIG. 1, the beam of light 126 reaches a photodetector 140. When the beam of light 126 reaches the photodetector 140, the optically transparent substrate 105 may be mapped and/or positioned, or marked by a marking device (not shown).

Using a conventional substrate, light from the light source 128 is absorbed or reflected in the peripheral edge region 130, or is otherwise blocked from reaching the photodetector 140 unless the orientation feature 136 is positioned as shown in FIG. 1. When using an optically transparent substrate 105 as described herein, the beam of light 126 may reach the photodetector 140 even when the orientation feature 136 is not positioned relative to the beam of light 126 as shown in FIG. 1. This transparency makes detection of the orientation feature 136 difficult if not impossible.

However, the optically transparent substrate 105 includes a texture 145 on the peripheral edge region 130. The texture 145 is opaque to the beam of light 126 such that the beam of light 126 does not reach the photodetector 140 unless the orientation feature 136 is positioned as shown in FIG. 1. The texture 145 enables detection of the orientation feature 136 and thus orientation of the optically transparent substrate 105.

The texture 145 may be one or more films deposited onto the peripheral edge region 130, a physical alteration of the peripheral edge region 130, or combinations thereof. The texture 145 enables proper notch or flat detection for substrates that are transparent to high ultraviolet light as well as light in other bandwidths. The texture 145 also minimizes substrate bow caused by interfacial stresses of thin film materials deposited on the optically transparent substrate 105.

Figure 2A:
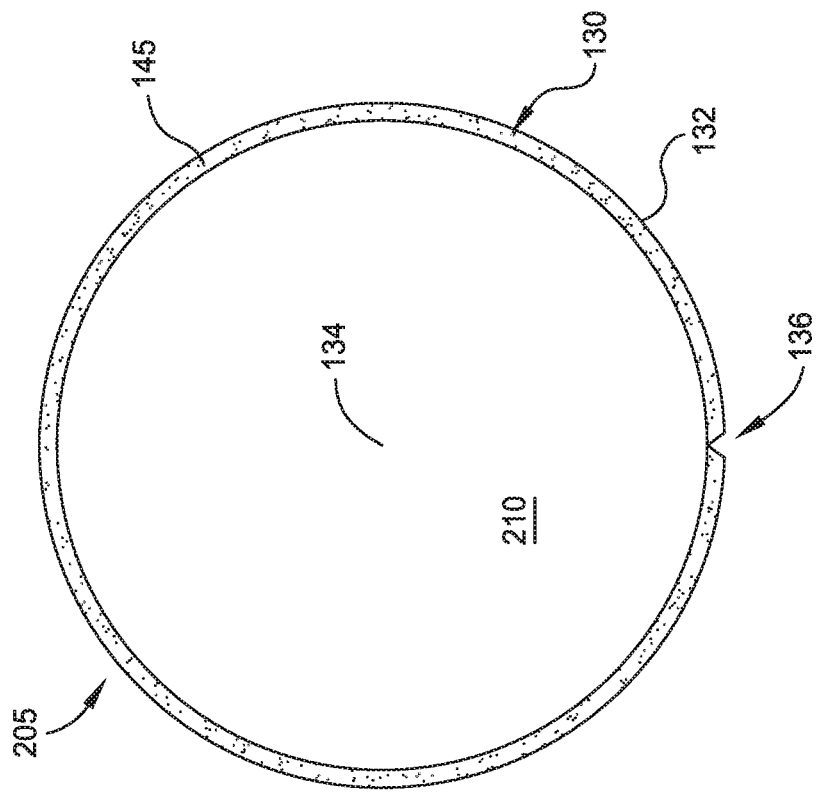
FIG. 2A is a plan view of one embodiment of an optically transparent substrate having a portion of a mask thereon.
Figure 2B:
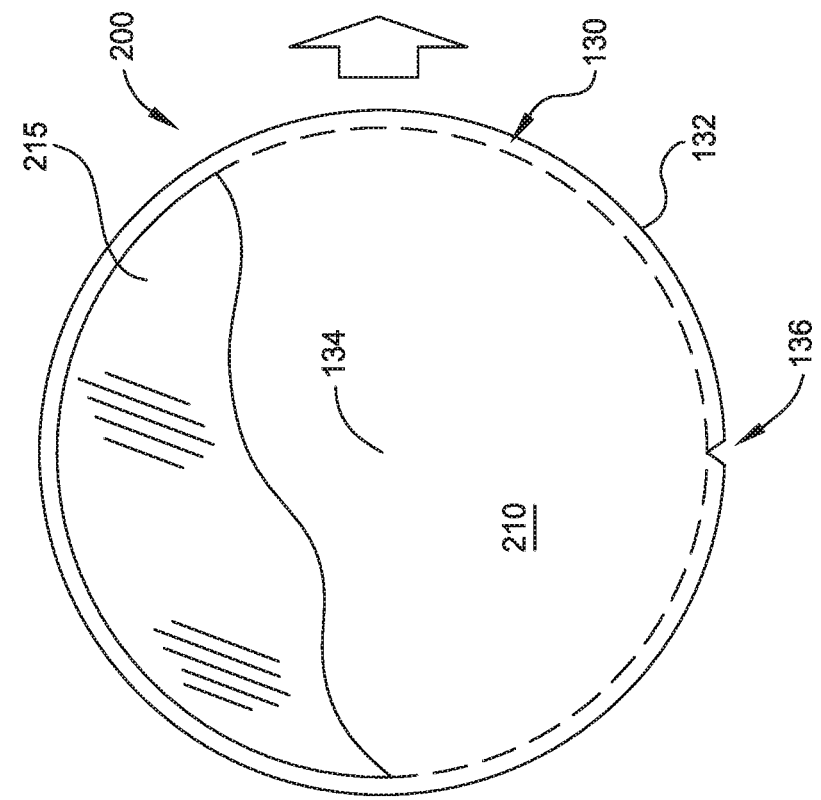
FIG. 2B is a plan view of another embodiment of an optically transparent substrate having a texture formed in a peripheral edge region.

FIGS. 2A and 2B are plan views of an optically transparent substrate 200 and 205, respectively. In FIG. 2A, the peripheral edge region 130 is shown in dashed lines. Each of the substrates 200 and 205 include a major surface 210, which may be a front side surface or a back side surface. The major surface(s) 210 and/or the portion of the substrates 200 and 205 within the peripheral edge region 130 are transparent to light.

In FIG. 2B, the optically transparent substrate 205 includes the texture 145 within or on the peripheral edge region 130. While the major surface 210 of the optically transparent substrate 205 is substantially transparent to light (e.g., an opacity of 5% to about 10%, or less, the peripheral edge region 130 has an opacity that is much greater than the opacity of the major surface(s) 210. For example, the major surface 210 of the optically transparent substrate 205 has a first opacity as described above, and the peripheral edge region 130, with the texture 145 thereon, has a second opacity that is greater than the first opacity. In one implementation, the peripheral edge region 130, with the texture 145 thereon, has a second opacity of about 65% to about 85%. The first opacity of the major surface(s) 210 as well as the second opacity of the peripheral edge region 130, with the texture 145 thereon, as described above, is measure across multiple wavelengths, such as between about 400 nanometers (nm) to about 800 nm. In some implementations, the second opacity of the peripheral edge region 130 is about 80% to about 85% at wavelengths between about 400 nm and about 550 nm.

In addition, the major surface 210 of the optically transparent substrate 205 has a first surface roughness that is less than a second surface roughness of the peripheral edge region 130. For example, the average surface roughness (Ra) of the major surface(s) 210 is about 2 nm to about 3 nm while the Ra of the texture 145 on the peripheral edge region 130 is about 100 nm, or greater, for example about 170 nm to about 180 nm, such as about 175 nm.

The texture 145 is applied by a laser etching process, a chemical etching process, a texturing process, or other process that alters the transparent quality of the peripheral edge region 130. In some implementations, a mask 215 (a portion is shown in FIG. 2A) is placed over the major surface 210 of the optically transparent substrate 200. The mask 215 is sized to cover the major surface 210 while leaving the peripheral edge region 130 exposed.

In some implementations, the texture 145 is formed by laser marking and/or texturing the peripheral edge region 130, depositing and patterning the peripheral edge region 130 using various semiconductor process compatible thin films, or a combination thereof, to form the optically transparent substrate 205. The process compatible thin films may be left on the peripheral edge region 130 for subsequent processes.

In other implementations, the texture 145 is formed by an abrasive blasting process using a nozzle to apply abrasive particles to the peripheral edge region 130 in a carrier gas, by blasting the peripheral edge region 130 with beads or sand, or by a water jet process that delivers abrasive particles to the peripheral edge region 130.

Implementations of the optically transparent substrate 105 and the optically transparent substrate 205 as disclosed herein enable utilization of glass or quartz substrates in electronic device fabrication chambers typically used for conventional semiconductor substrates. For example, the optically transparent substrate 105 or the optically transparent substrate 205 as described herein may be used for organic light emitting diode (OLED) manufacture, for example in nanometer scale color filter fabrication. In other examples, the optically transparent substrate 105 or the optically transparent substrate 205 as described herein may be used to fabricate three-dimensional structures for optical lenses as well as other optical device fabrication.

While the foregoing is directed to embodiments of the present disclosure, other and further embodiments of the disclosure may be devised without departing from the basic scope thereof.

What is claimed is:

1. A substrate for electronic device formation, the substrate comprising:
   a major surface having a peripheral edge region with an orientation feature formed therein; and
   a roughened surface texture formed on the peripheral edge region, the roughened surface texture having an opacity that is greater than an opacity of the major surface, wherein the orientation feature is a notch, and an inner tip of the notch extends to, and coincides with, an innermost edge of the roughened surface texture.

2. The substrate of claim 1, wherein an average surface roughness of the major surface is less than an average surface roughness of the roughened surface texture.

3. The substrate of claim 1, wherein the major surface includes a first opacity of about 5% to about 10% at wavelengths of about 400 nanometers to about 800 nanometers.

4. The substrate of claim 3, wherein the roughened surface texture includes a second opacity of about 65% to about 85%.

5. The substrate of claim 1, wherein the opacity of the major surface is about 5% to about 10%.

6. The substrate of claim 5, wherein the opacity of the peripheral edge region is about 65% to about 85%.

7. The substrate of claim 5, wherein the major surface has a first surface roughness and the peripheral edge region has a second surface roughness that is greater than the first surface roughness.

8. The substrate of claim 7, wherein the first surface roughness is about 2 nanometers to about 3 nanometers, and the second surface roughness is about 100 nanometers, or greater.

9. A substrate for electronic device formation, the substrate comprising:
a major surface having a peripheral edge region with an orientation feature formed therein and having a first average surface roughness (Ra); and
a roughened surface texture formed on the peripheral edge region, the roughened surface texture having a second Ra that is greater than the first Ra, wherein the peripheral edge region has an opacity that is greater than an opacity of the major surface, wherein the orientation feature is a notch, and an inner tip of the notch extends to, and coincides with, an innermost edge of the roughened surface texture.

10. The substrate of claim 9, wherein the opacity of the major surface is about 5% to about 10%.

11. The substrate of claim 10, wherein the opacity of the peripheral edge region is about 65% to about 85%.

12. The substrate of claim 9, wherein the major surface includes a first opacity of about 5% to about 10% at wavelengths of about 400 nanometers to about 800 nanometers.

13. The substrate of claim 12, wherein the texture includes a second opacity of about 65% to about 85%.

14. The substrate of claim 9, wherein the first Ra is about 2 nanometers to about 3 nanometers, and the second Ra is about 100 nanometers, or greater.

15. The substrate of claim 9, wherein the peripheral edge region comprises an edge exclusion zone.

16. An optical device substrate, the substrate comprising:
a body comprising a quartz material, the body having a roughened major surface having a peripheral edge region with an orientation feature formed therein, wherein a roughened surface texture is formed on the peripheral edge region, the roughened surface texture having an opacity that is greater than an opacity of the major surface, wherein the orientation feature is a notch, and an inner tip of the notch extends to, and coincides with, an innermost edge of the roughened surface texture.

17. The substrate of claim 16, wherein an average surface roughness of the roughened major surface is greater than an average surface roughness of the roughened surface texture.

18. The substrate of claim 16, wherein the opacity of the peripheral edge region is about 65% to about 85%.

\* \* \* \* \*